United States Patent [19]

Saari et al.

[11] 4,176,344
[45] Nov. 27, 1979

[54] INTEGRATED CIRCUIT BINARY WEIGHTED DIGITAL-TO-ANALOG CONVERTER

[75] Inventors: Veikko R. Saari, Spring Lake Heights; Masakazu Shoji, Warren, both of N.J.

[73] Assignee: Bell Telephone Laboratories, Incorporated, Murray Hill, N.J.

[21] Appl. No.: 581,623

[22] Filed: May 28, 1975

[51] Int. Cl.[2] .......................................... H03K 13/02
[52] U.S. Cl. ........................ 340/347 DA; 307/296 R; 307/310; 340/347 CC; 340/347 M
[58] Field of Search ................. 340/347 DA, 347 CC; 324/105, 106; 307/296, 297, 310

[56] References Cited

U.S. PATENT DOCUMENTS 3,940,760  2/1976  Brokaw ........................ 340/347 DA

OTHER PUBLICATIONS

Holloway et al., "A High Yield, Second Generation 10-Bit Monolithic DAC," IEEE Int'l. Solid-State Circuits Conference, Digest of Technical Papers, Feb. 1976, pp. 106, 107, 236.

Kelson, "A Monolithic 10-b Digital to Analog Converter...," IEEE Journal of Solid-State Circuits, Dec. 1973, vol. SC-8, No. 6.

Primary Examiner—Thomas J. Sloyan
Attorney, Agent, or Firm—Richard B. Havill

[57] ABSTRACT

An integrated circuit digital-to-analog converter circuit of the binary weighted current summing type in which the emitter potentials of the transistor current sources are maintained substantially equal by controlling the voltage differential between the base electrodes of the current source transistors. In one disclosed embodiment, the base electrodes of the transistor current sources are connected to a resistive divider network and the voltage across each of the resistors is maintained substantially equal to $(kT/q) \ln 2$. The disclosed circuit can be used as an alternative to, or in combination with, prior art emitter-scaling techniques.

8 Claims, 4 Drawing Figures

INTEGRATED CIRCUIT BINARY WEIGHTED DIGITAL-TO-ANALOG CONVERTER

BACKGROUND OF THE INVENTION

This invention pertains to digital-to-analog converter circuits. More particularly, this invention relates to integrated circuits which employ the summing of binary weighted currents to effect digital-to-analog conversion.

Binary weighted digital-to-analog converters (DACs) are well known in the art and many circuit implementations have been provided to satisfy various requirements. One type of prior art circuit comprises a plurality of parallel connected current sources and a current summing network wherein each current source is responsive to a particular signal bit of an applied digital signal and supplies a binary weighted current to the summing network, i.e., the currents supplied to the summing network in response to successive bits of the digital input signal vary by a factor of 2. Most binary weighted DACs of this type include current sources which are transistors connected in a common base configuration with the emitter electrodes connected to the individual legs or rungs of an R-2R ladder network. Because each current source transistor of such a converter operates with a different collector current, each current source transistor exhibits a different base-to-emitter voltage ($V_{BE}$). Such a variation in $V_{BE}$, in turn, causes the potential across each leg of the R-2R ladder network to deviate from that potential which would be induced solely by the respective binary weighted current source, thus introducing errors in the analog output signal.

In the above-described prior art integrated binary weighted DACs, the base electrodes of the current source transistors are commonly connected to a voltage source and, to equalize the $V_{BE}$'s of the current source transistors, the current source transistor emitter areas are generally scaled according to the magnitude of the binary weighted current to be generated. This technique maintains a relatively constant current density in the emitter region of each current source transistor and thereby maintains the $V_{BE}$ of all current source transistors substantially equal.

Emitter area scaling, however, has at least two distinct limitations. First, it is extremely difficult to control the photomask process utilized in the manufacture of integrated circuits to that degree necessary to maintain the required scaling accuracies. Secondly, since the emitter areas are necessarily related to one another in a binary fashion, the emitter area of the current source generating the largest current can become extremely large. For example, in an 8-bit DAC, the emitter area of the current source associated with the most significant bit of the digital input signal must be 128 times as large as the emitter area of the current source associated with the least significant bit. This requires a great deal of area on the silicon chip and is subject to integrated circuit photoprocessing limitations.

It is accordingly an object of this invention to provide an integrated circuit binary weighted DAC which maintains the emitter electrodes of the current source transistors at substantially equal voltages without requiring emitter area scaling.

SUMMARY OF THE INVENTION

This and other objects are achieved in accordance with the principles of this invention by establishing the base drive circuit of the current source transistors in a binary weighted DAC such that the base electrode of each current source transistor is maintained at a potential which will establish substantially equal voltages at the respective emitter electrodes.

In one illustrative embodiment of the subject invention substantially equal valued resistors are connected between the base electrodes of the current sources associated with adjacent bit locations of the digital input signal, thus forming a circuit path comprising a plurality of series connected resistors, with the base electrodes of the current sources connected to the resistor junctions. A temperature-dependent voltage source is connected to the resistor chain to establish the voltage differential between the base electrodes of the current source transistors so that the current source emitter potentials are substantially equal and substantially free from temperature-induced voltage variations.

In the preferred embodiment the temperature-dependent voltage source is included within a feedback loop which includes an additional current source transistor for establishing the magnitude of the current of the current source associated with the most significant bit of the digital input signal substantially equal to an externally applied reference current.

DETAILED DESCRIPTION

Figure 1:
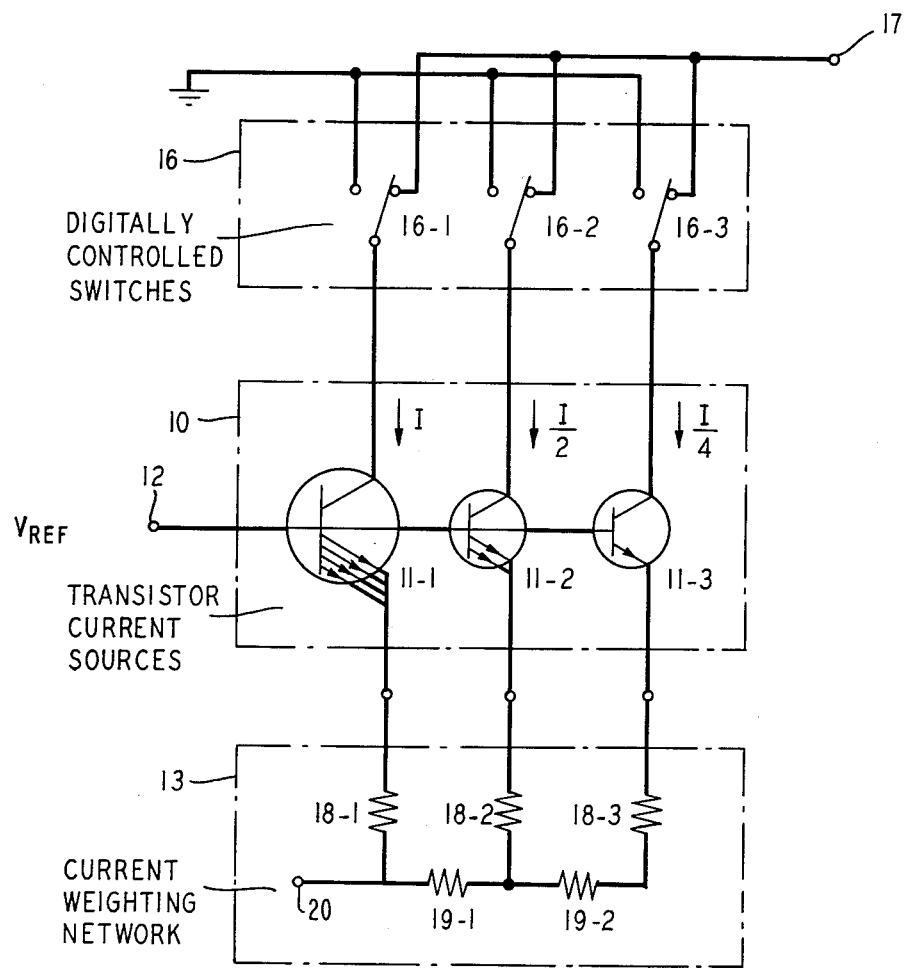
FIG. 1 depicts a prior art DAC circuit utilizing emitter scaling techniques.

FIG. 1 schematically depicts a prior art 3-bit DAC which is useful in understanding the subject invention. In FIG. 1, transistors 11-1, 11-2, and 11-3, which are contained within dashed outline 10, are connected in a common base configuration so as to effect current sources. The base electrodes of transistors 11-1, 11-2, and 11-3 are commonly connected to a reference potential supplied to voltage reference terminal 12, and the emitters of the current source transistors 11-1, 11-2, and 11-3, are respectively connected to appropriate terminals of current weighting network 13. Current weighting network 13 establishes the currents of current source transistors 11-1, 11-2, and 11-3 such that the transistor collector currents are related in a binary manner, e.g., the current generated by transistor 11-2 is twice the current generated by transistor 11-3 and the current generated by transistor 11-1 is twice the current generated by transistor 11-2. In FIG. 1 this relationship is conveniently denoted by assuming an arbitrary current of I in transistor 11-1, and currents of I/2 and I/4 in transistors 11-2 and 11-3, respectively.

Current weighting network 13 normally comprises a resistive R-2R ladder network such as that depicted in FIG. 1. The R-2R ladder network of FIG. 1 comprises resistors 18-1, 18-2, and 18-3 and resistors 19-1 and 19-2 wherein resistors 18-1, 18-2, and 18-3 are identical in resistance value and are each twice the resistance value of each of the resistors 19-1 and 19-2. The first terminals of resistors 18-1, 18-2, and 18-3 are respectively connected to the emitter electrodes of transistors 11-1, 11-2, and 11-3. Resistor 19-1 is connected between the second terminals of resistors 18-1 and 18-2 and resistor 19-2 is connected between the second terminals of resistors 18-2 and 18-3. The junction of resistor 18-1 and resistor 19-1 is connected to bias terminal 20.

Switches 16-1, 16-2 and 16-3 are digitally controlled, each switch being responsive to a particular bit signal of an applied digital input signal such that the collector electrodes of transistors 11-1, 11-2, and 11-3 are individually connected to analog output terminal 17 whenever the particular bit controlling the associated switch (16-1, 16-2, or 16-3) is at a first predetermined binary level, e.g., a binary 1, and each collector of transistors 11-1, 11-2, and 11-3 is individually connected to a fixed potential (represented in FIG. 1 as circuit ground potential) whenever the associated input bit is at a second binary level, e.g., binary 0. For example, in FIG. 1 switch 11-1 is associated with the most significant bit (MSB) of the 3-bit digital input signal. Thus, whenever the applied MSB is representative of a binary 1, switch 16-1 is in the position shown in FIG. 1 and the current supplied by transistor 11-1 contributes to the output current which is obtained at terminal 17. If, however, the MSB of the applied digital signal is a binary 0, switch 16-1 connects the collector electrode of current source 11-1 to a fixed potential such as circuit ground, and current source 11-1 does not contribute to the output current at terminal 17. Thus, it can be observed that any 3-bit digital input signal applied to the circuit of FIG. 1 results in a corresponding analog current at terminal 17 such that the output current is an analog representative of the weighted binary value of the digital input signal.

As illustrated in FIG. 1, the emitter area of transistor 11-1 is two times greater than the emitter area of transistor 11-2 and is four times greater than the emitter area of transistor 11-3. Since the emitter areas are scaled in proportion to the current generated by the respective current sources, the emitter current density is substantially the same in each current source transistor. Thus, substantially equal base-to-emitter voltages are produced in each current source transistor and, since the potential at each particular emitter electrode is equal to the potential applied to voltage reference terminal 12 minus the $V_{BE}$ of that particular transistor, substantially identical emitter voltages are maintained.

Figure 2:
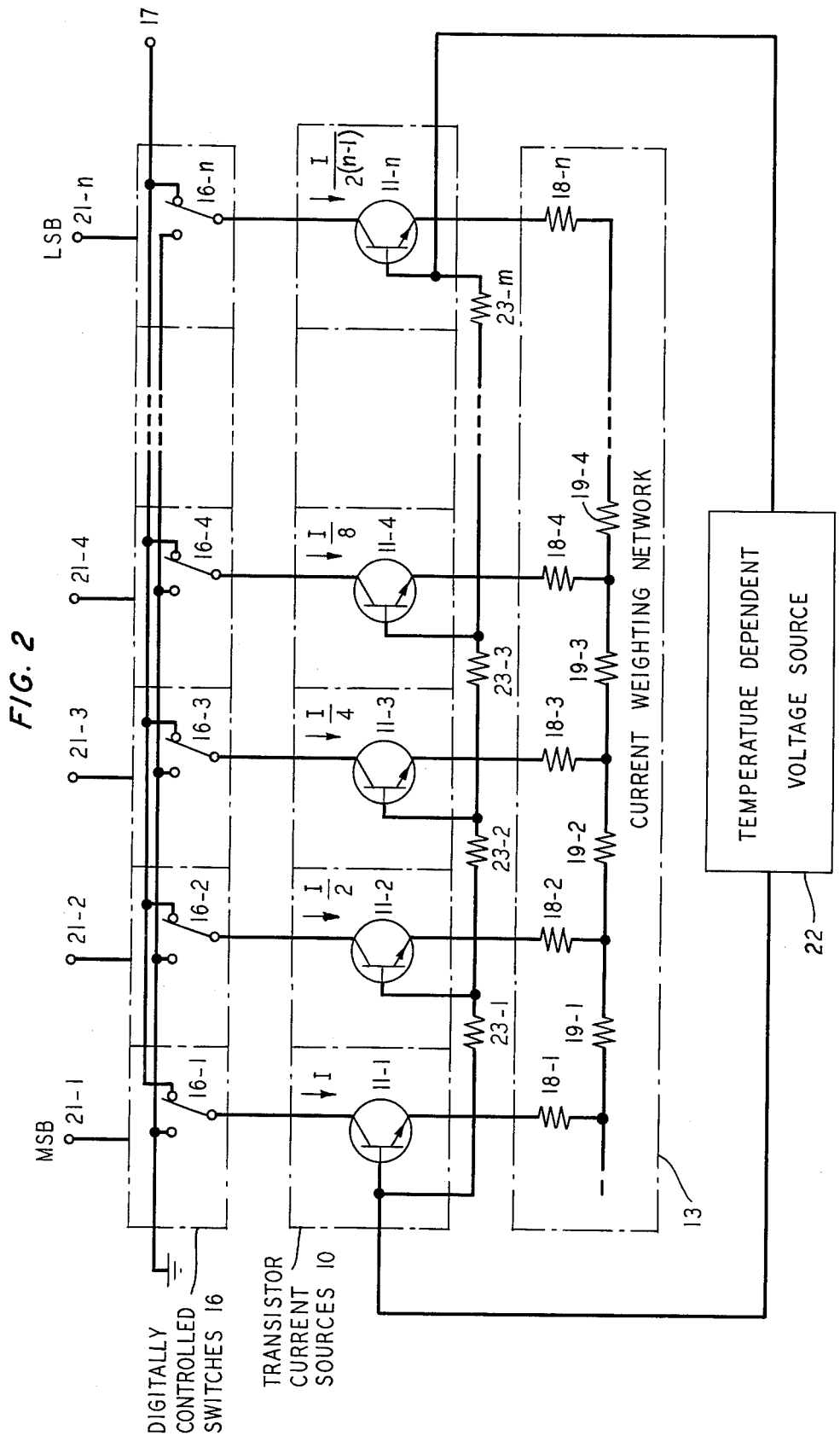
FIG. 2 illustrates, in partial schematic-partial block diagram form, a DAC circuit constructed in accordance with this invention.

FIG. 2 depicts one embodiment of the present invention which maintains substantially identical current source emitter potentials without employing emitter area scaling of the current source transistors. It can be noted that the circuit of FIG. 2, like the prior art circuit of FIG. 1, comprises a plurality of parallel connected circuit branches. For example, the circuit branch associated with MSB of the digital input signal includes digitally controlled switch element 16-1 and transistor current source 11-1, with the emitter electrode of transistor 11-1 connected to the rung or leg of the R-2R resistive ladder network of current weighting network 13 which includes resistor 18-1. The digital input signal is applied to input terminals 21-1 through 21-n, with the MSB applied to terminal 21-1, the next-most significant bit applied to terminal 21-2, etc., with each succeedingly less significant bit applied sequentially to input terminals 21 so that the least significant bit is applied to terminal 21-n. Resistors 23-1 through 23-m are connected between the base electrodes of current source transistors 11-1 through 11-n so as to form a chain of series connected resistors, with each resistor 23-i connected between the base electrodes of transistors 11-i and 11-(i+1). The base electrode of transistor 11-1 and resistor 23-1 are each connected to a first terminal of temperature-dependent voltage source 22, and the base electrode of current source 11-n and resistor 23-m are each connected to the second terminal of temperature-dependent current source 22. Thus, temperature-dependent voltage source 22 and resistors 23 form a closed circuit path which maintains the voltage differential between the base electrodes of current source transistors 11-i and 11-(i+1) identically equal to the voltage drop across resistor 23-i.

It will be recognized by those skilled in the art that the $V_{BE}$ of each current source transistor is substantially $$V_{BE}=(kT/q)\ln(I_E/I_O) \qquad (1)$$

where k is Boltzmann's constant, q is the unit electron charge, T is the temperature in degrees Kelvin, and $I_E$ and $I_O$ are respectively the transistor emitter current and the saturation current of the base-emitter junction.

Thus, if transistors 11-1 through 11-n each exhibit substantially identical base-emitter saturation currents and have substantially identical base-emitter junction geometry, it can be realized that maintaining the voltage differential between base electrodes of the $i^{th}$ and $k^{th}$ transistors substantially equal to $(kT/q)\ln(I_{Ek}/I_{Ei})$, where $I_{Ek}$ and $I_{Ei}$ are the emitter current of transistors 11-k and 11-i respectively maintains substantially identical potentials at the respective transistor emitter electrodes. Thus, referring to the circuit of FIG. 2, it can be realized that substantially equal current source emitter voltages can be maintained by utilizing substantially identical resistance values for each resistor 23-1 through 23-m and by establishing the magnitude of the voltage generated by temperature-dependent voltage source 22 substantially equal to $(n-1)(kT/q)\ln 2$, where n is the number of bit locations in the digital input signal.

Figure 3:
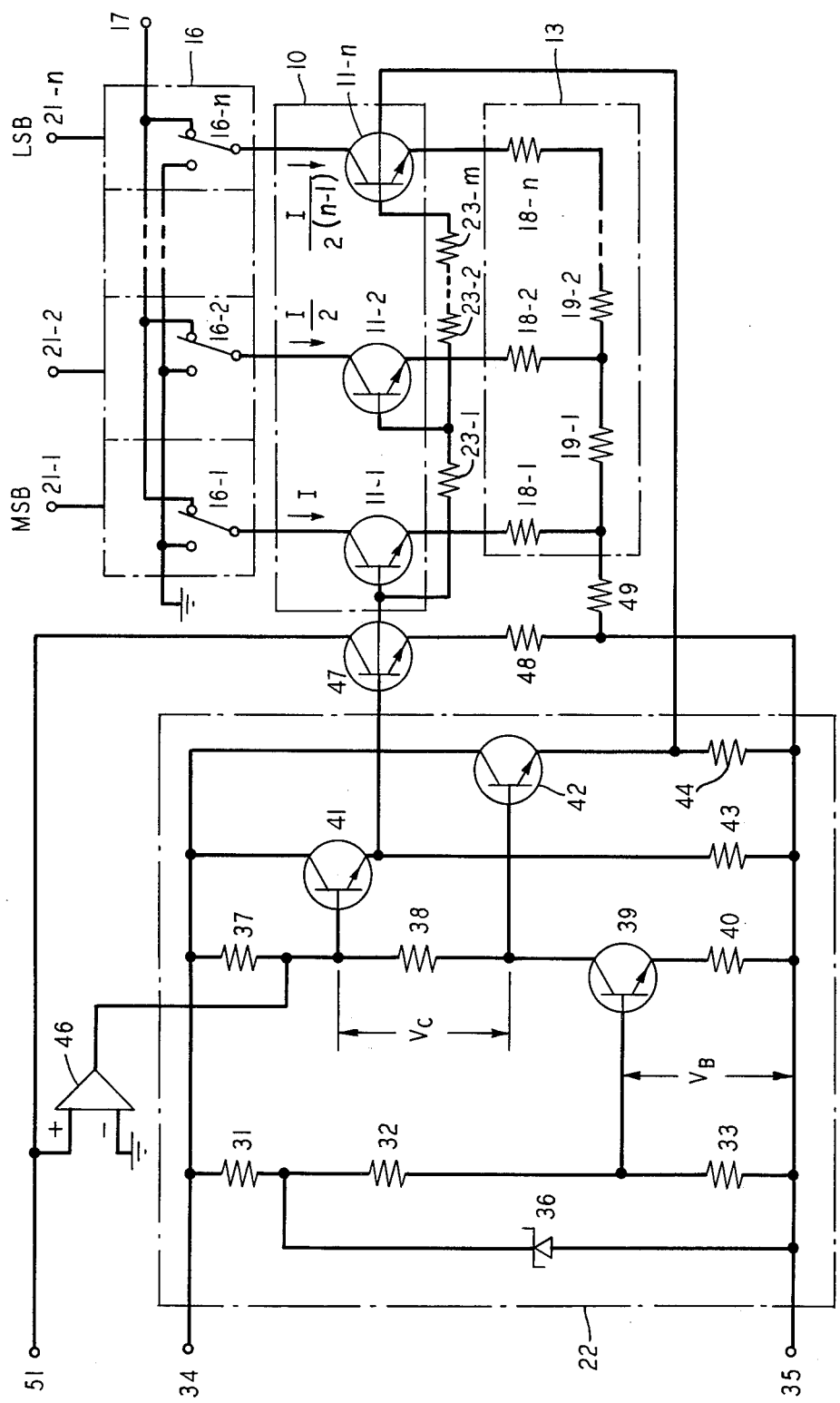
FIG. 3 depicts a temperature-dependent thermal voltage source satisfactory for the practice of this invention and further depicts the interconnection of the thermal voltage source, the base electrodes of the current source transistors, and an operational amplifier to form a feedback loop which is advantageous in the practice of this invention.

FIG. 3 depicts an illustrative embodiment of the present invention which schematically illustrates a temperature-dependent voltage source suitable for the practice of this invention and further includes circuit means for establishing the current level of the transistor current sources 11-1 through 11-n in response to an applied reference current to thereby establish a scale factor or multiplier which is associated with the analog output signal. For convenience, elements of FIG. 3, identical to the elements of FIGS. 1 and 2, are indicated by the same identifiers used in FIGS. 1 and 2.

Temperature-dependent voltage source 22 of FIG. 3 includes a zener diode reference voltage source, a transistor stage for generating the temperature-dependent voltage reference, and a pair of emitter follower transistors to establish a low output impedance. The zener diode reference voltage source includes resistors 31, 32, and 33 which are connected in series between bias terminals 34 and 35 and zener diode 36, which is connected between bias terminal 35 and the junction of resistors 31 and 32.

The transistor stage which generates the temperature-dependent voltage includes resistors 37 and 38 which are series connected between bias terminal 34 and the collector electrode of transistor 39. The emitter electrode of transistor 39 is connected to bias terminal 35 via resistor 40. Since the base electrode of transistor 39 is connected to the junction of resistors 32 and 33 of the zener diode reference voltage source, it can be shown that the voltage across resistor 38, denoted as $V_C$ in FIG. 3, is substantially $$V_C = (R_{38}/R_{40})(V_B - V_{BE}) \quad (2)$$

where $V_B$ is the voltage supplied to the base electrode of transistor 39 by zener diode 36, and the voltage divider comprising resistors 32 and 33 and $V_{BE}$ denotes the base-to-emitter voltage of transistor 39.

If a particular temperature range is considered, Equation (2) can be expressed as $$V_C = (R_{38}/R_{40}) V_B - [V_{BE1} - \alpha(T - T_1)] \quad (3)$$

where $T_1$ is the mean temperature of the temperature range of interest in degrees Kelvin, $V_{BE1}$ is the base-to-emitter voltage of transistor 39 at temperature $T_1$, and $\alpha$ is the voltage gradient of the base-to-emitter voltage in volts per degrees Kelvin. Thus, if $V_B$ is established substantially equal to $V_{BE1} + \alpha T$, Equation (3) can be expressed as $$V_C = (R_{38}/R_{40})\alpha t$$

and it can be recognized that proper selection of resistors 38 and 40 will establish a temperature-dependent voltage $V_C$ substantially equal to the desired voltage of $(n-1)(kT/q) \ln 2$.

It has been found that the effects due to the temperature coefficient of zener diode 36 and the finite $\beta$ of transistor 39 can be compensated for by proper selection of resistors 32, 33, 38, and 40. For example, in one embodiment in which $n=7$, $T_1=300$ degrees K, transistor 39 exhibited a minimum $\beta$ of 100 with a base-emitter saturation current of $1.5 \times 10^{15} \exp(46{,}597 - 13979/T)$ amperes, and zener diode 36 exhibited an avalanche breakdown voltage of substantially 8 volts and a temperature coefficient of approximately 4 millivolts per degrees Centigrade, it was found that application of Equation (3) and standard temperature analysis determined that the necessary temperature dependent voltage ($6(kT/q) \ln 2$) could be maintained over a wide operating range by establishing $V_B = 1.39$ volts, $R_{38} = 410$ ohms, and $R_{40} = 2800$ ohms.

It will be recognized from the foregoing description of temperature-dependent voltage source 22 that voltage $V_B$ can be generated by circuit means other than the described zener diode circuit, e.g., a bandgap voltage reference source, or any one of various known regulated electronic voltage sources.

Transistors 41 and 42 are connected as emitter followers, with the collector electrodes commonly connected to bias terminal 34, the emitter electrodes respectively connected to bias terminal 35 by resistors 43 and 44, and the base electrodes respectively connected to the junction of resistors 37 and 38 and the junction of resistor 38 and the collector electrode of transistor 39. Since the circuit path comprising resistors 23-1 through 23-m and the base electrodes of current source transistors 11-1 through 11-m is connected between the emitter electrodes of transistors 41 and 42, it is advantageous to select the resistance values of resistors 43 and 44 such that the emitter current density in transistor 41 is substantially identical to that of transistor 42. Maintaining equal current densities substantially eliminates error which could be introduced in the generated temperature-dependent voltage due to temperature-induced variations in the $V_{BE}$'s of transistors 41 and 42.

Control of the magnitude of the current supplied by current source transistor 11-1 (denoted as I in FIG. 3), and thus the current of each remaining transistor current source (11-2 through 11-n) is achieved by the circuit comprising operational amplifier 46, transistor 47, and resistors 48 and 49. As is known in the art, controlling the current magnitude of the current sources allows the circuit user to establish a scale factor or multiplier which determines the digital-to-analog conversion factor, i.e., the analog output signal will be $d_n s$, where $d_n$ is the decimal equivalent value of the digital input signal and s is the controllable scale factor.

Referring to FIG. 3, transistor 47 is a transistor whose geometry is substantially identical to the geometry of current source transistors 11-1 through 11-n, and resistors 48 and 49 are connected to form an additional section of the R-2R ladder network of current weighting network 13. Specifically, resistors 48 and 49 are connected in series between the emitter electrode of transistor 47 and the junction of resistors 18-1 and 19-1, with the junction of resistors 48 and 49 connected to bias terminal 35. The base electrode of transistor 47 is connected in common with the emitter electrode of transistor 41 and the base electrode of current source transistor 11-1. The collector electrode of transistor 47 is connected to reference current terminal 51. The noninverting input terminal of operational amplifier 46 is connected to reference current input terminal 51, the inverting input terminal of operational amplifier 46 is connected to circuit ground, and the output terminal of operational amplifier 46 is connected to the base electrode of transistor 41.

It can be observed that, when a reference current is supplied to terminal 51, transistor 47 acts as a current sink and the input current which reaches the noninverting input terminal of operational amplifier 46 is equal to the difference between the collector current of transistor 47 and the input reference current. If the reference current and the collector current of transistor 47 are not substantially identical, the difference current is amplified by operational amplifier 46 and subsequently applied to the base electrode of transistor 47 via emitter follower transistor 41. The current so induced at the base electrode of transistor 47 causes an appropriate increase or decrease in the collector current of transistor 47 so as to make the collector current substantially identical to the reference current. Since the base electrodes of transistor 47 and 11-1 are commonly connected and the emitter circuit of transistor 47 is an R-2R ladder section identical to the R-2R ladder section in the emitter circuit of transistor 11-1, the collector current of current source transistor 11-1 is substantially equal in magnitude to the reference current applied to terminal 51. Accordingly, it can be realized that the circuit of FIG. 3 establishes a feedback circuit which includes temperature-dependent voltage source 22, operational amplifier 46, the base drive resistor chain comprising resistors 23-1 through 23-m, and additional current source transistor 47.

Figure 4:
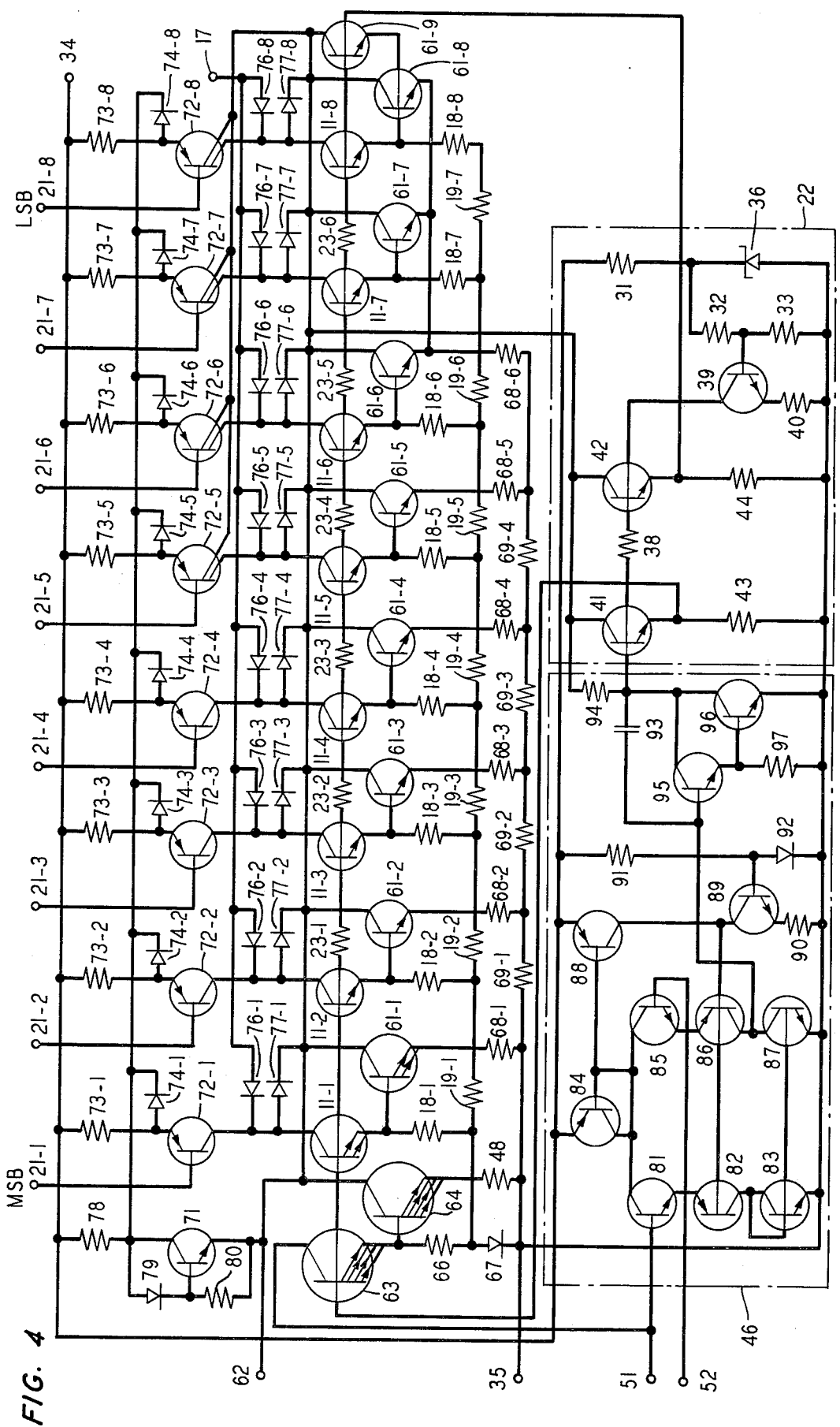
FIG. 4 is a schematic diagram of an integrated circuit 8-bit DAC which is a preferred embodiment of this invention.

The circuit of FIG. 4 is an 8-bit silicon integrated DAC which illustrates a preferred embodiment of this invention in that the circuit of FIG. 4 utilizes several refinements which further enhance circuit operation. For convenience, circuit elements of FIG. 4, which are identical to elements of FIGS. 2 and 3, are labeled with the same identifiers utilized in FIGS. 2 and 3.

It can first be observed that the 8-bit converter of FIG. 4 utilizes a variation of the prior art emitter scaling techniques combined with the resistive voltage divider-temperature-dependent voltage source techniques of the above-described embodiment of this invention. In the circuit of FIG. 4, the emitter area of transistor current source 11-1 is twice that of the remaining transistor current sources. Such emitter scaling in those transistor current source stages carrying relatively high emitter currents can be advantageous, since the high emitter currents could otherwise develop fairly substantial error voltages due to voltage drops across the emitter contact resistance. Since the emitter contact resistance is inversely related to the emitter area and emitter scaling is determined on the basis of collector current, the voltage drop across the emitter contact resistance remains substantially constant in scaled emitter stages. Accordingly, the emitter contact voltage drops of transistors 11-1 and 11-2 of FIG. 4 are substantially identical.

Various other techniques can, of course, be devised where it is deemed necessary to compensate for emitter contact voltage differentials. For example, rather than utilizing emitter scaling in the high current stages, resistor 23-i of each high current stage could be altered in value to compensate for the emitter contact resistance of transistor current source 11-(i+1).

It can also be seen in FIG. 4 that a second current source-resistive ladder network comprising transistors 61-1 through 61-8, resistors 68-1 through 68-6, and resistors 69-1 through 69-4 has been added to the converter circuit embodiments of FIGS. 2 and 3. Transistors 61-1 through 61-8 serve as current source transistors, with the collector of each of transistors 61-1 through 61-8 connected to bias terminal 62 which is normally operated at ground potential. The base electrodes of transistors 61-1 through 61-8 are respectively connected to the emitter electrodes of current source transistors 11-1 through 11-8, and the emitter electrodes of current source transistors 61-1 through 61-6 are connected to one electrode of resistors 68-1 through 68-6 which form rungs or legs in the second R-2R ladder. Resistors 69-1 through 69-4 are respectively connected between the second electrodes of resistors 68-1 through 68-5 to complete the second R-2R ladder network. This second current source-resistive ladder network compensates for the finite $\beta$ of transistors 11-1 through 11-8 by extracting current from the emitter electrodes of each current source transistor which is substantially identical to the base current of each of the respective transistors (11-1 through 11-8).

Since the finite $\beta$ of reference current source transistor 47 may also result in an error current, transistor 47 of FIG. 3 has been replaced by transistors 63 and 64 in the circuit of FIG. 4. Referring to FIG. 4, it can be noted that the emitter electrode of transistor 63 is connected to the base electrode of transistor 64, and the collector electrode of transistor 64 is connected to bias terminal 62. The base electrode of transistor 64 is connected to bias terminal 35 by series connected resistor 66 and diode 67. The emitter areas of transistors 63 and 64 and the junction area of diode 67 are advantageously scaled such that the voltage drop across diode 67 is substantially identical to the base-to-emitter voltage of transistor 64, thereby ensuring that substantially identical collector currents flow in transistors 63 and 64.

The circuit of FIG. 4 includes PNP switching stages which perform the switching function of the switches denoted as elements 16-1 through 16-n in FIGS. 1 through 3. These switches comprise PNP transistors 72-1 through 72-8, with the base of each transistor connected to digital input terminals 21-1 through 21-8. The collectors of transistors 72-1 through 72-8 are respectively connected to the collector electrodes of current source transistors 11-1 through 11-8, and the emitter electrodes of switching transistors 72-1 through 72-8 are respectively connected to bias terminal 34 by means of resistors 73-1 through 73-8. Diodes 74-1 through 74-8 are respectively connected between the emitter electrodes of transistors 72-1 through 72-8 and the collector electrode of reference voltage transistor 71; diodes 76-1 through 76-8 are respectively connected between output terminal 17 and the collector electrodes of transistors 72-1 through 72-8; and diodes 77-1 through 77-8 are respectively connected between the collector electrodes of switching transistors 72-1 through 72-8 and bias terminal 62. The potential at each emitter electrode of switching transistors 72-1 through 72-8 is maintained substantially 3 $V_{BE}$ above the potential connected to bias terminal 62 by means of the associated diodes 74-1 through 74-8 and a reference voltage stage which comprises transistor 71, diode 79, and resistors 78 and 80. The collector of transistor 71 is connected to bias terminal 34 by resistor 78 and is also connected to the base electrode of transistor 71 by diode 79. The emitter electrode of transistor 71 is connected to bias terminal 62, and the base electrode of transistor 71 is connected to bias terminal 62 through resistor 80. Since transistor 71 operates in the conduction region and the emitter electrodes of current switches 72-1 through 72-8 are connected to bias terminal 62 through like-poled diodes 74-1 through 74-8, diode 79, and the base emitter electrode of transistor 71, the emitter electrode of each switching transistor 72 is maintained at a potential 3 $V_{BE}$ above the potential at bias terminal 62.

Since each switching circuit operates in an identical manner, overall circuit operation can be understood by observing the operation when a digital input corresponding to a binary 1 and 0 is applied to a single digital input terminal, e.g., the most significant bit terminal 21-1.

Assume first that a binary input signal sufficient to cut off transistor 72-1 is applied to input terminal 2-1. In such a case, the current flowing through resistor 73-1 is diverted or "steered" to regulator transistor 71 via diode 74-1. Since output terminal 17 is normally maintained at a potential substantially equal to the potential at bias terminal 62 (normally ground potential), the potential at the collector of transistor 72-1 is below the potential at terminal 62 by an amount equal to the voltage across diode 76-1 (essentially 1 $V_{BE}$) and diode 77-1 is reverse biased. Since substantially no current flows through reverse biased diode 77-1, a current substantially equal to the current generated by current source transistor 11-1 flows through diode 76-1 from output terminal 17. Thus, it can be observed in the circuit of FIG. 4 that a digital input voltage sufficient to cut off transistors 72 can be utilized as a binary 1 and will effect a contribution to the output current of the DAC.

When the voltage applied to terminal 21-1 corresponds to a logical 0, say, 0.4 volt or less, transistor 72-1 conducts and current flows from bias terminal 34 through resistor 73-1. The value of resistor 73-1 is established such that the current is greater than the current of current source transistor 11-1. Thus, a current equal to the difference between the collector current of transistor 72-1 and the current generated by current source transistor 11-1 forward biases diode 77-1, thereby clamping the collector electrode of transistor 72-1 at substantially one diode drop above the potential applied to bias terminal 62. Since the output terminal 17 of the circuit is substantially at the same potential as terminal 62, diode 76-1 is reverse biased and not current flows into output terminal 17.

From the foregoing, it can be seen that the circuit of FIG. 4 operates on positive logic, that is, whenever a signal corresponding to a binary 1 is applied to one or more of digital input terminals 21-1 through 21-8, a current corresponding to the binary weighted value of the digital input signal is produced at terminal 17.

It can be noted in the circuit of FIG. 4 that switching transistors 72-5 through 72-8 are dual collector devices, wherein the second collector is connected to bias terminal 62. This is advantageous in embodiments wherein lateral PNP transistors are utilized for switches 72 since it permits operation of transistors 72-5 through 72-8 at a collector current level which ensures maximum switching speed. The use of the split collector is, of course, only advantageous in stages where the collector current would otherwise be below that collector current which effects minimum switching speed of the lateral PNP transistor.

In FIG. 4, an amplifier stage which performs the function of the operational amplifier, denoted as element 46 of FIG. 3, is included within dashed outline 46. Basically, this amplifier comprises a differentially connected input which utilizes composite PNP transistors formed by the combination of NPN transistors 81 and 85 with PNP transistors 82 and 86 and a Darlington connected common emitter output stage. Specifically, input terminal 51 is connected to the base electrode of transistor 81, and input terminal 52 is connected to the base electrode of transistor 85. The collector electrodes of transistors 81 and 85 are commonly connected to bias terminal 34 through diode connected transistor 84, and the emitter electrodes of transistors 81 and 85 are respectively connected to the emitter electrodes of transistors 82 and 86. The collector electrode of transistor 82 is connected to bias terminal 35 by diode connected transistor 83, and the collector electrode of transistor 86 is commonly connected to the collector electrode of transistor 87 and the base electrode of transistor 95. The base electrode of transistor 87 is connected to the effective anode of diode connected transistor 83, and the emitter electrode of transistor 87 is connected to bias terminal 35. The effective cathode of diode connected transistor 84 is connected to the base electrode of transistor 88, and the emitter of transistor 88 is connected to bias terminal 34. The collector electrode of transistor 88 is commonly connected to the base electrodes of transistors 82 and 86 and to the collector electrode of transistor 89. Transistor 89 is a current source whose bias is established by series connected resistor 91 and diode 92, which are connected between bias terminals 34 and 35, with the junction between resistor 91 and diode 92 connected to the base electrode of transistor 89 and the emitter electrode of transistor 89 connected to bias terminal 35 by resistor 90.

Transistors 95 and 96 are connected in a Darlington configuration with the collectors commonly connected, the base electrode of transistor 96 connected to the emitter electrode of transistor 95, and the emitter electrode of transistor 96 connected to bias terminal 35. Resistor 97 is connected between the base electrode of transistor 96 and bias terminal 35. Resistor 94, which serves as a collector load resistor and also serves as the bias resistor 37 of FIG. 3, is connected between the commonly connected collector electrodes of transistors 95 and 96 and bias terminal 62. Capacitor 93, which ensures high frequency stability, is connected between the base and collector electrodes of transistor 95.

The input stage, which comprises transistors 81 through 88, is biased in the following manner. Neglecting the base currents, the collector current of transistor 88 and transistor 84 is substantially equal to the current generated by the transistor current source comprising transistor 89, resistors 90 and 91, and diode 92, which, for the sake of convenience, can be denoted as current $I_a$. The collector current of transistor 84 is split between transistors 81 and 85, producing a collector current in both transistors 82 and 86 substantially equal to $I_a/2$. Since transistors 83 and 87 are matched, the collector currents of transistors 83 and 87 are also equal to $I_a/2$. Second stage transistors 95 and 96 are biased via resistors 97 and 94. Essentially, all the current through resistor 94 flows through transistor 96, while the current in transistor 95 is substantially equal to the $V_{BE}$ of transistor 96 divided by resistor 97.

The a-c signal operation of the amplifier stage can be understood by assuming a small difference signal is applied between terminals 51 and 52. Such a small differential a-c input signal causes the collector currents in transistors 82 and 86 to change in an equal and opposite manner, the amount of change being dependent on the transconductance of input transistors 81, 82, 85, and 86. Differential to single-ended conversion is accomplished by diode connected transistor 83 and transistor 87, the total differential input current being fed to the high impedance node at the base of transistor 95. Transistors 95 and 96 act as a common emitter gain stage and, as is described in the explanation of the circuit of FIG. 3, couples the difference between the reference current applied to terminal 51 and the current established in the reference current source transistor 63 to the base electrode of emitter follower transistor 41.

It will be understood by those skilled in the art that the circuit embodiment of FIG. 4 is merely one DAC embodiment which may advantageously utilize the principles of the present invention. It can be further realized that several circuit modifications can be utilized to adapt the circuit of FIG. 4 to various other system requirements. For example, in high-speed applications, it may be advantageous to employ NPN switching stages rather than the PNP switching circuits depicted in FIG. 4, or, in certain applications, it may be necessary to operate from negative logic wherein a binary 0 is to effect current to flow into output terminal 17. In such a case, NPN switching circuits may again be advantageously employed.

What is claimed is:

1. An integrated circuit digital-to-analog converter for developing an analog output signal in response to an applied n-bit digital signal comprising;

a plurality of n transistor current sources $S_i$, i=1,2, ... n;

an R-2R ladder network having n sections;

means for connecting the $i^{th}$ section of said ladder network to the emitter electrode of the $i^{th}$ transistor current source, said R-2R ladder network establishing the current level of each of said n transistor current sources so that the current level of the (i+1) transistor current source is I/2 of the current level of the $i^{th}$ transistor current source;

a plurality of n switching means, $T_i$, i=1,2, ... n, each switching means, $T_i$, responsive to the $i^{th}$ bit signal of said applied n-bit digital signal, each switch $T_1$ connecting each current source $S_i$ to an output terminal of said digital-to-analog converter circuit whenever said $i^{th}$ bit signal assumes a predetermined binary quantity;

a plurality of n-1 resistors, $R_i$, i=1,2, ... (n-1), having substantially equal resistance values, each resistor $R_i$ connected between the base electrodes of transistor current sources $S_i$ and $S_{(i+1)}$;

an additional transistor current source having substantially the same transistor geometry as said n transistor current sources, the base electrode of said additional current source connected to the base electrode of transistor current source $S_i$;

an additional R-2R ladder section connected to said n section R-2R ladder network and to the emitter electrode of said additional transistor current source transistor;

a temperature-dependent voltage supply circuit including a first and second transistor with the collector electrodes thereof connected to a first bias terminal and the emitter electrodes thereof respectively connected to a second bias terminal by a first and second resistor, a third resistor connected between said first bias terminal and the base electrode of said first transistor, a fourth resistor connected between the base electrodes of said first and second transistors, and a third transistor with the collector electrode thereof connected to said base electrode of said second transistor and the emitter electrode of said third transistor connected to said second bias terminal by a fifth resistor;

said emitter of said first transistor further connected to said base electrode of said additional transistor current source, and said emitter electrode of said second transistor further connected to the base electrode of transistor current source Sn;

circuit means for supplying a predetermined voltage to the base electrode of said third transistor; and an operational amplifier circuit having an inverting input terminal, a noninverting input terminal, and an output terminal, said noninverting input terminal commonly connected to a reference terminal and to the collector electrode of said additional transistor current source, said inverting input terminal connected to a terminal of fixed potential, and said operational amplifier output terminal connected to the base electrode of said first transistor.

2. The digital-to-analog converter circuit of claim 1 wherein said circuit means for supplying said predetermined voltage to the base electrode of said third transistor includes a sixth, seventh, and eighth resistor respectively series connected between said first and second bias terminals and a zener diode connected between said second bias terminal and the junction of said sixth and seventh resistors, the junction of said seventh and eighth transistors connected to said base electrode of said third transistor.

3. An integrated 8-bit digital-to-analog converter circuit including eight input terminals for the application of an 8-bit digital input word and an output terminal for supplying a current indicative of the binary value of said digital input word comprising:

eight current sources, respectively associated with the 8-bits of said digital input signal, and a first R-2R resistive ladder network, the emitter electrodes of each current source transistor connected to a leg of said first R-2R ladder, the first one of said current source transistors associated with the most-significant bit of said digital input word, said first current source transistor having an emitter area twice as large as the emitter area of said second through eighth current source transistors, the base electrodes of said first current source transistor connected to the base electrode of said second current source transistor;

first through sixth resistors of substantially identical resistance value, said first resistor connected between the base electrodes of said second and third current source transistors, said second resistor connected between the base electrodes of said third and fourth current source transistors, said third resistor connected between the base electrodes of said fourth and fifth current source transistors, said fourth resistor connected between the base electrodes of said fifth and sixth current source transistors, said fifth resistor connected between the base electrodes of said sixth and seventh current source transistors, and said sixth resistor connected between the base electrodes of said seventh and eighth current source transistors;

means for maintaining the voltage across each of said first through sixth resistors substantially equal to $(kT/q) \ln 2$;

first through eighth switching means respectively associated with said first through eighth digital input terminals, each of said switching means responsive to the signal applied to said associated digital input terminal for directing the current of said current sources transistor associated with said digital input terminal to said output terminal whenever the magnitude of said signal applied to said associated digital input terminal exceeds a predetermined value; and reference current means for establishing the current level in each of said eight current source transistors in response to an applied signal, wherein said means for maintaining said voltage across each of said first through sixth resistors is a temperature-dependent voltage source, the output terminals thereof connected to the base electrodes of said second and eighth current source transistors, said temperature dependent voltage source having an output voltage substantially equal to $6(kT/q) \ln 2$, and wherein said temperature-dependent voltage source includes:

first, second, and third transistors, the collector electrode of said first transistor connected to the base electrode of said second transistor, the collector electrodes of said second and third transistors commonly connected to a first terminal of fixed potential;

seventh, eighth, and ninth resistors, said seventh and eighth resistors respectively connected between a second terminal of fixed potential and the emitter electrodes of said second and third transistors, said ninth resistor connected between the base electrodes of said second and third transistors;

tenth, eleventh, and twelfth resistors, series connected between a third terminal of fixed potential and said second terminal of fixed potential, the junction between said eleventh and twelfth resistors connected to the base electrode of said first transistor;

a zener diode connected between said second terminal of fixed potential and the junction between said tenth and eleventh resistors; and a thirteenth resistor connected between the emitter electrode of said first transistor and said second terminal of fixed potential, said emitter electrode of said third transistor connected to that output terminal of said temperature-dependent voltage source which is connected to said base electrode of said second current source transistor, and said emitter electrode of said second transistor connected to that output terminal of said temperature-dependent voltage source which is connected to said base electrode of said eighth current source transistor.

4. The integrated 8-bit digital-to-analog converter circuit of claim 3 wherein said reference current means includes a ninth current source transistor, the emitter electrode thereof connected to said second terminal of fixed potential by a first diode, said emitter electrode also connected to the first resistive leg of said first R-2R ladder network by a fourteenth resistor, the base electrode of said ninth current source transistor connected to the base electrode of said second current source transistor, the collector electrode of said ninth current source transistor connected to a reference current input terminal, said reference current means further including an operational amplifier having a noninverting input terminal and an output terminal, said noninverting input terminal connected to said reference current input terminal, and said operational amplifier output terminal connected to the base electrode of said third transistor.

5. The integrated circuit 8-bit digital-to-analog converter of claim 4 wherein each of said first through eighth switching means include:

a fourth transistor, the base electrode of said fourth transistor connected to that digital input terminal associated with said switching means and the collector electrode of said fourth transistor connected to the collector electrode of that current source transistor associated with said digital input terminal;

a fifteenth resistor connected between the emitter electrode of said fourth transistor and said third terminal of fixed potential;

second, third, and fourth diodes, said second diode connected between said collector electrode of said fourth transistor and said output terminal, said third diode connected between said collector electrode of said fourth transistor and said first terminal of fixed potential, the anode of said fourth diode connected to said emitter electrode of said fourth transistor; and means for maintaining the cathode of said fourth diode at a predetermined voltage differential from said first terminal of fixed potential.

6. The integrated circuit 8-bit digital-to-analog converter of claim 5 wherein said means for maintaining the cathode of said fourth diode at said predetermined voltage differential includes a sixteenth resistor, a fifth diode and a seventeenth resistor serially connected between said third and first terminals of fixed potential, and a fifth transistor with the collector electrode thereof connected to the cathode of said fourth diode and to the junction between said sixteenth resistor and said fifth diode, the base electrode of said fifth transistor connected to the junction between said fifth diode and said seventeenth resistor, and the emitter electrode of said fifth transistor connected to said first terminal of fixed potential.

7. The integrated circuit 8-bit digital-to-analog converter to claim 6 further comprising tenth through eighteenth current source transistors and a second R-2R resistive ladder network, the emitter electrodes of said tenth through eighteenth current source transistors each connected to a leg of said second R-2R resistive ladder network, the collector electrodes of said tenth through eighteenth current source transistors connected to said first terminal of fixed potential, the base electrode of said tenth current source transistor connected to the emitter electrode of said ninth current source transistor, and the base electrodes of said eleventh through eighteenth current source transistors respectively connected to the emitter electrodes of said first through eighth current source transistors.

8. The integrated circuit 8-bit digital-to-analog converter of claim 7 wherein said operational amplifier includes sixth, seventh, eighth, ninth, and tenth transistors, the base electrode of said sixth transistor connected to said operational amplifier noninverting input terminal, the collector electrodes of said sixth and seventh transistors commonly connected to said third terminal of fixed potential by a first diode-connected transistor, the emitter electrodes of said sixth and seventh transistors respectively connected to the emitter electrodes of said eighth and ninth transistors, the base electrode of said seventh transistor connected to the inverting input terminal of said operational amplifier, the collector electrode of said ninth transistor connected to the collector electrode of said tenth transistor, the emitter electrode of said tenth transistor connected to said second terminal of fixed potential, the base electrode of said tenth transistor connected to the collector electrode of said eighth transistor, the collector of said eighth transistor connected to said second terminal of fixed potential by a second diode-connected transistor, said operational amplifier further including an eleventh, twelfth, thirteenth, and fourteenth transistor, the emitter electrode of said eleventh transistor connected to said third terminal of fixed potential, the base electrode of said eleventh transistor connected to the commonly connected collector electrodes of said sixth and seventh transistors, the collector electrode of said eleventh transistor commonly connected to the base electrodes of said eighth and ninth transistors and to the collector electrode of said twelfth transistor, the emitter electrode of said twelfth transistor connected to said second terminal of fixed potential by an eighteenth resistor, the base electrode of said twelfth transistor connected to said second terminal of fixed potential by a sixth diode and further connected to said third terminal of fixed potential by a nineteenth resistor, the base electrode of said thirteenth transistor connected to the collector electrode of said tenth transistor, the emitter electrode of said thirteenth transistor connected to the base electrode of said fourteenth transistor and further connected to said second terminal of fixed potential by a twentieth resistor, the collector electrodes of said thirteenth and fourteenth transistors commonly connected to said operational amplifier output terminal, the emitter electrode of said fourteenth transistor connected to said second terminal of fixed potential, and said commonly connected collector terminals of said thirteenth and fourteenth transistors connected to the base electrode of said thirteenth transistor by a first capacitor.

* * * * *